United States Patent [19]

Schutten et al.

[11] Patent Number: 4,541,001

[45] Date of Patent: Sep. 10, 1985

[54] BIDIRECTIONAL POWER FET WITH SUBSTRATE-REFERENCED SHIELD

[75] Inventors: Herman P. Schutten, Milwaukee; James A. Benjamin, Waukesha, both of Wis.; Robert W. Lade, Fort Myers, Fla.

[73] Assignee: Eaton Corporation, Cleveland, Ohio

[21] Appl. No.: 421,933

[22] Filed: Sep. 23, 1982

[51] Int. Cl.$^3$ .................. H01L 29/78; H01L 29/06; H01L 29/40

[52] U.S. Cl. .................. 357/23.4; 357/55; 357/53; 357/23.14; 357/41

[58] Field of Search ...... 357/23 HV, 23 VD, 23 MG, 357/39, 41, 47, 53, 55

[56] References Cited

U.S. PATENT DOCUMENTS

| | | | |
|---|---|---|---|
| 2,994,811 | 8/1961 | Senitzky | 357/55 |
| 3,629,667 | 12/1971 | Lubart et al. | 357/39 |
| 4,163,988 | 8/1979 | Yeh et al. | 357/23 VD |
| 4,199,774 | 4/1980 | Plummer | 357/41 |
| 4,219,835 | 8/1980 | Van Loon | 357/53 |
| 4,243,997 | 1/1981 | Natori et al. | 357/22 |
| 4,300,150 | 11/1981 | Colak | 357/52 |
| 4,364,073 | 12/1982 | Becke et al. | 357/23 VD |
| 4,364,074 | 12/1982 | Garnache et al. | 357/41 |
| 4,414,560 | 11/1983 | Lidow | 357/39 |
| 4,455,740 | 6/1984 | Iwai | 29/571 |
| 4,470,062 | 9/1984 | Muramatsu | 357/55 |

FOREIGN PATENT DOCUMENTS

| | | | |
|---|---|---|---|
| 0073585 | 6/1979 | Japan | 357/39 |
| 2089118 | 6/1982 | United Kingdom | 357/23 MG |

OTHER PUBLICATIONS

P. Ou-Yang, "Double Ion-Implantation V-MOS Tech.," J. of S-S Ckts., vol. SC-12 #1, Feb. 1977, pp. 3-10.

H. Lee et al., "Short-Channel Field-Effect Transistors in v-Grooves", IBM Tech. Discl. Bulletin, vol. 22, #8B, Jan. 1982, pp. 3630-3634.

C. Hu, "A Parametric Study of Power MOSFETs", IEEE Electron Device Conference, Paper CH1461-3/79, 0000-0385.

Ammar & Rogers, "UMOS Transistors on Silicon", Transaction IEEE, eD-27, pp. 907-914, May, 1980.

IEEE Transactions on Electron Devices, vol. ed 25#10, "Non Planar Power FETs by Salama et al. Oct. 1978.

*Primary Examiner*—Andrew J. James
*Assistant Examiner*—Mark Prenty
*Attorney, Agent, or Firm*—Andrus, Sceales, Starke & Sawall

[57] ABSTRACT

Bidirectional power FET structure is disclosed with high OFF state voltage blocking capability. A shielding electrode is insulated between first and second gate electrodes in a notch between laterally spaced source regions and channel regions joined by a common drift region around the bottom of the notch. The shielding electrode is ohmically connected to the substrate containing the common drift region to be at the same potential level thereof and within a single junction drop of a respective main electrode across the junction between the respective channel containing region and drift region. The steering diode function for referencing the shielding electrode is performed by junctions already present in the integrated structure, eliminating the need for discrete dedicated steering diodes. The shielding electrode prevents the electric field gradient toward the gate electrode on one side of the notch from inducing depletion in the drift region along the opposite side of the notch. This prevents unwanted inducement of conduction channels in the drift region during the OFF state of the FET.

19 Claims, 8 Drawing Figures

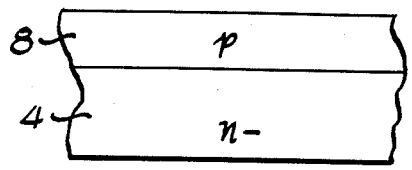
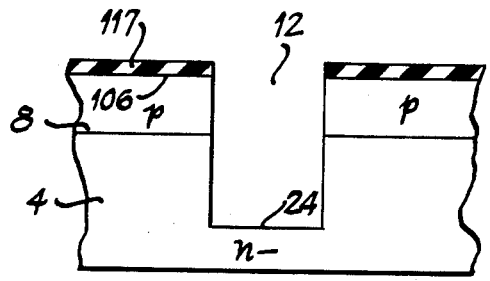
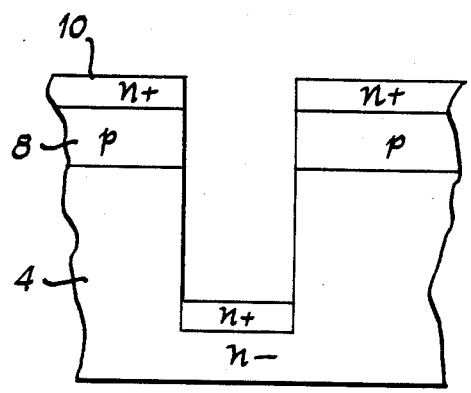
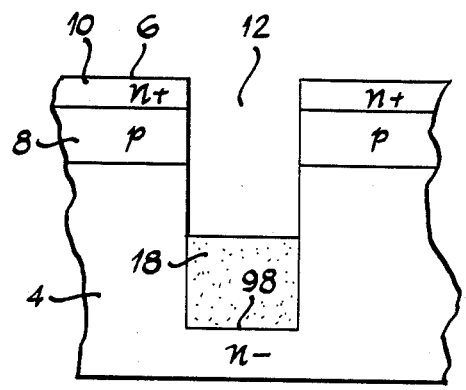
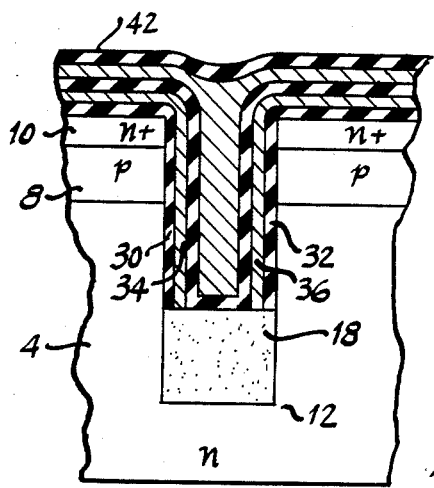

BIDIRECTIONAL POWER FET WITH SUBSTRATE-REFERENCED SHIELD

TECHNICAL FIELD

The invention relates to power switching semiconductors, and more particularly to power MOSFETs (metal oxide semiconductor field effect transistors), and the like.

BACKGROUND AND SUMMARY

The present invention provides an improvement over subject matter disclosed in our copending application Ser. No. 390,479 filed June 21, 1982, entitled "Lateral Bidirectional Shielded Notch FET". Our copending application discloses lateral power FET structure which is bidirectional, i.e. current can flow in either direction when the device is in the ON state, whereby to afford AC application. Voltage blocking capability is increased by a notch gate structure and a shielding electrode. A notch extends downwardly from a top major surface to separate left and right source regions and left and right channel regions, and direct the drift region current path between the channels around the bottom of the notch. First and second gate electrodes are provided along opposite sides of the notch proximate the channels for controlling bidirectional conduction.

A shielding electrode is insulated between the first and second gate electrodes. In the OFF state, the shielding electrode shields the right notch edge drift region portion from electric field gradients from the left gate electrode. This prevents the left gate electrode from causing attraction of given polarity carriers in the drift region towards the right edge of the notch, which in turn prevents unwanted notch edge drift region depletion and inducement of conduction channels. The shielding electrode likewise shields the left notch edge drift region portion from electric field gradients from the right gate electrode in the OFF state, to prevent unwanted depletion and inducement of conduction channels in the drift region.

The present invention affords optimal utilization of the integrated structure. PN junctions already present in the integrated structure are additionally used to provide the steering diode function for referencing the shielding electrode to the appropriate potential. This eliminates the need for dedicated discrete diodes.

BRIEF DESCRIPTION OF THE DRAWINGS

FIGS. 2-6 show the preferred processing of the structure of FIG. 1.

DETAILED DESCRIPTION

Figure 1:
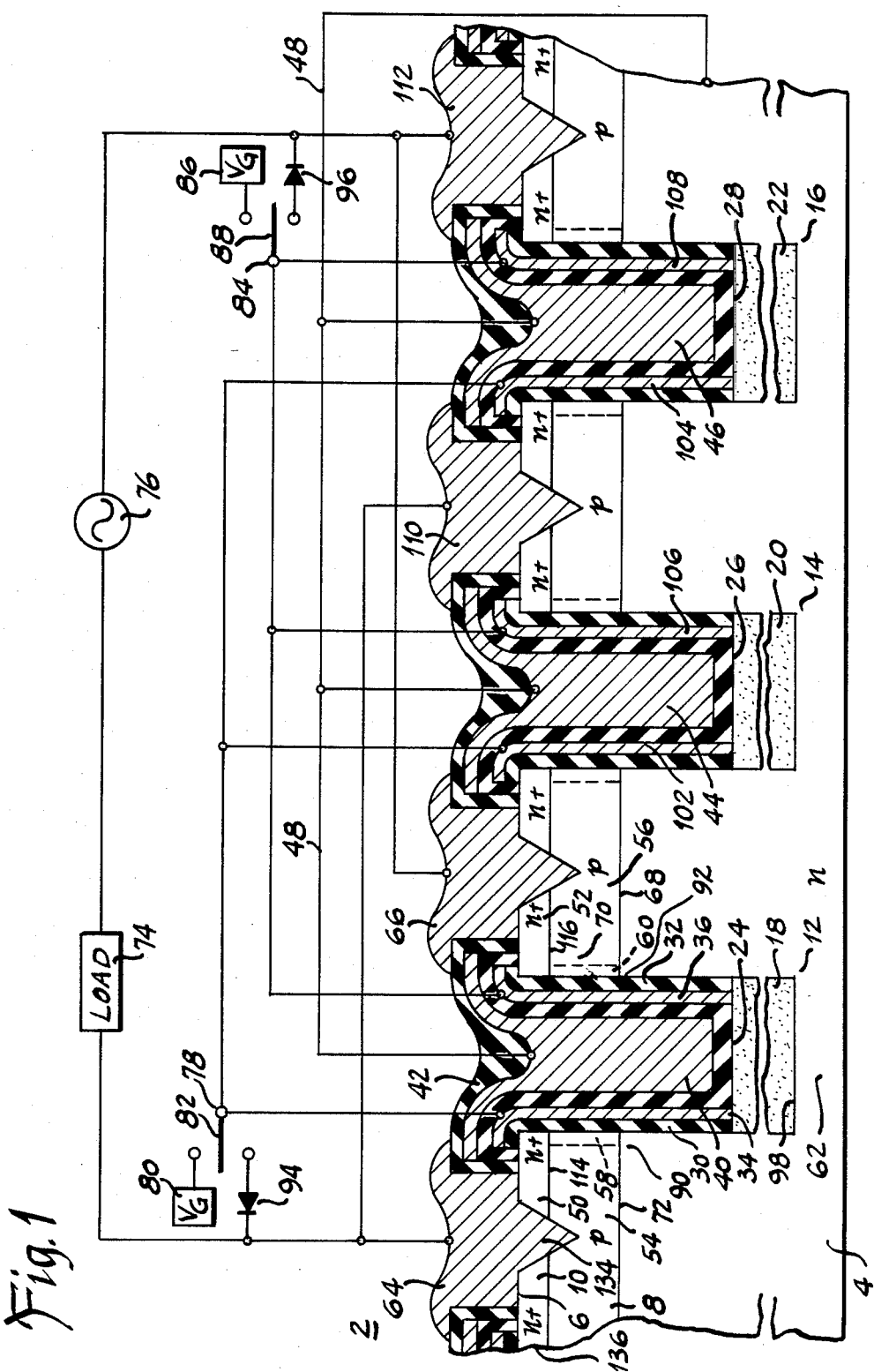
FIG. 1 is a schematic sectional view of bidirectional power FET structure constructed in accordance with the invention.

FIG. 1 shows lateral bidirectional power FET structure 2. FET structure 2 includes a substrate 4 of one conductivity type, for example n type, having a top major surface 6. A p layer 8 is diffused into the substrate from top major surface 6, or epitaxially grown, to a predetermined depth forming a first top layer. A second top layer 10 is formed in first top layer 8 by ion implantation and/or diffusion from top major surface 6, or epitaxial growth, of n+ layer 10 to a given depth.

A plurality of notches 12, 14, 16 and so on, are formed in the substrate from top major surface 6 through n+ top layer 10 and p layer 8 into substrate region 4. These notches may be anisotropically etched, as known in the art; C. Hu, "A Parametric Study of Power MOSFETs", IEEE Electron Device Conference, Paper CH1461-3/79, 0000-0385; IEEE Transactions Electron Devices, Vol. ED-25, No. 10, Oct. 1978; and Ammar and Rogers, "UMOS Transistors on Silicon", Transactions IEEE, ED-27, pages 907-914, May, 1980. Alternatively, the notches may be formed by a porous silicon region in accordance with the known anodization technique of passing a fixed current through the localized region in the presence of concentrated hydrogen fluoride to create a structural change in the silicon which remains single crystalline with the substrate but becomes porous. In the case of anisotropic etching, the bottom of the notch is filled with insulative material. In the case of anodization, the substrate is subjected to an oxidizing atmosphere such that the oxygen enters the pores in the porous notched regions and rapidly oxidizes these regions as shown at 18, 20, 22 and so on, which regions are still single crystalline with substrate 4 but substantially nonconductive. Before or after the anodization, the notches are etched down to respective levels 24, 26, 28 and so on.

In notch 12, silicon dioxide insulating layers 30 and 32 are grown along the inner facing surfaces of the notch. First and second gate electrodes 34 and 36 are then formed along the left and right vertical sides of the notch, as by shadow evaporation of conductive material such as aluminum from an angle or low pressure chemical vapor deposition (LPCVD) of polysilicon. Another insulating oxide layer 38 is provided along the facing sides of the gate electrodes and along the bottom of the upper notch section, as by chemical vapor deposition. A shielding electrode means 40 is then deposited in the notch and is insulated between the gate electrodes by insulating layer 38. Another oxide layer 42 is then deposited over the shielding electrode 40. The insulated gating and shielding structure in notches 14 and 16 is comparable. Each of shielding electrodes 40, 44, 46 and so on, are ohmically connected by connection 48 to substrate 4.

Notch 12 extends from top major surface 6 downwardly through top layer 10 and first top layer 8 into substrate region 4. Notch 12 separates the second top layer 10 into first and second left and right source regions 50 and 52 and extends therebetween. Notch 12 separates the first top layer 8 into first and second regions 54 and 56 having left and right channel regions 58 and 60 and extends therebetween. The substrate region 4 around the notch forms a drain or drift region 62 of the substrate.

Main electrode metalization 64 is deposited on top major surface 6 in an anisotropically etched groove extending into and through source region 50 and into p region 54 having channel 58. Main electrode 64 ohmically contacts source 50 and channel containing region 54. Main electrode metalization 66 is comparably deposited on top major surface 6 in an anisotropically etched groove and ohmically contacts source 52 and channel containing region 56.

Upon application of a positive voltage to gate electrode 34 with respect to left main electrode 64, electrons in p region 54 are attracted to channel region 58 to invert the conductivity type therein to n type. This allows electron flow from n+ source region 50 through channel 58 into drift region 62 of substrate 4. If right main electrode 66 is positive with respect to left main electrode 64, current may then flow from p region 56 momentarily across a forward biased PN junction 68 into drift region 62, then through channel 58 to source region 50 and left main electrode 64. As soon as current starts to flow through the FET, the voltage across main electrodes 66 and 64 drops, which in turn reduces the potential in various regions of the FET, including portion 70 of p layer 56 adjacent the right FET channel 60. This falling potential causes carrier electron flow into channel region 60 because portion 70 becomes negative relative to right gate electrode 36 at a given gate potential, whereby positive right gate electrode 36 attracts electrons into right channel region 60 to invert the conductivity type thereof to n type, and hence render channel 60 conductive. Forward biased PN junction 68 conducts only momentarily until the second channel 60 turns ON.

The main current path through FET 2 is from right main electrode 66 through right source region 52, downwardly through right vertical channel region 60 along the right side of notch 12, then further downwardly into drift region 62 along the right side of the notch, then around the bottom of notch 12, then upwardly along the left side of notch 12 in drift region 62 of substrate 4, then upwardly through left vertical channel region 58 along the left side of notch 12, then through left source region 50 to left main electrode 64.

The structure is bidirectional, and thus current may also flow from left main electrode 64 to right main electrode 66 when right gate 36 is positive with respect to right main electrode 66. Electrons in p layer 56 are attracted into channel region 60 by gate 36 to thus invert channel region 60 to n type and hence allow electron flow from n+ source region 52 through channel 60 into drift region 62 in substrate 4. If left main electrode 64 is positive with respect to right main electrode 66, current then flows from p layer region 54 momentarily across forward biased PN junction 72 until channel 58 turns ON. The main current path is from left main electrode 64 through left source 50, through left channel 58, through drift region 62, through right channel 60, through right source 52 to right main electrode 66. Main electrode 66 thus serves as an electron current source when a negative voltage is applied thereto relative to the voltage on main electrode 64, and serves as an anode when a positive voltage is applied thereto relative to the voltage on main electrode 64.

The application of electrical gate potential to gate electrodes 34 and 36 enables them to produce electric fields of sufficient intensity to invert the conductivity type in the first and second channel regions 58 and 60. Upon application of voltage of either polarity to the first and second source regions 50 and 52, electric current can flow in a respective corresponding direction between them, under control of the electrical gate potential of the gate electrode means 34 and 36. The current flow between spaced apart regions 50 and 52 is controllable by controlling the electric fields in channel regions 58 and 60, which in turn are controllable by controlling the electric potential on the gate electrode means 34 and 36.

In the absence of gate potential on gate electrodes 34 and 36, channel regions 58 and 60 are p type, and the device is in a blocking OFF state. Current from main electrode 64 to main electrode 66 is blocked by junction 68. Current flow in the other direction from main electrode 66 to main electrode 64 is blocked by junction 72.

Bidirectional FET 2 may be used to control AC power. FIG. 1 schematically shows a load 74 and a source of AC power 76 connected across main electrodes 66 and 64. Gate electrode 34 is connected by a gate terminal 78 to a source of gate potential 80 through switch means 82. Gate electrode 36 is connected by a gate terminal 84 to a source of gate potential 86 through switch means 88. In the ON state of FET 2, switches 82 and 88 are in an upward position such that given polarity gate potential is applied to gate electrodes 34 and 36. The gate potential is higher than the most negative of the main electrodes in each half cycle.

When main electrode 66 is positive with respect to main electrode 64, as driven by AC source 76, gate electrode 34 is positive with respect to negative main electrode 64 connected to source region 50 and p region 54 containing channel 58. Hence, channel 58 is inverted to n type and conduction occurs, i.e. current flows from positive main electrode 66 through source region 52, through channel 60, through drift region 62 around the bottom of notch 12 in substrate 4, through channel 58, through source 50 to negative main electrode 64 and through load 74.

In the other half cycle of the AC source 76, main electrode 64 is positive with respect to main electrode 66, and gate electrode 36 is positive with respect to negative main electrode 66 connected to source 52 and p layer region 56 containing channel 60. Conduction is thus enabled through channel 60, and current flows from positive main electrode 64 through source 50, through channel 58, through drift region 62 around the bottom of notch 12 in substrate 4, through channel 60, to source 52 and main electrode 66.

Shielding electrode means 40 prevents electric field divergence induced depletion in drift region portions 90 and 92, which in turn prevents unwanted inducement of conduction channels in the drift region during the OFF state. This enables the use of nonfloating gates, i.e. the referencing of gate electrodes 34 and 36 to the same potential level of one or more of the main electrodes in the OFF state of FET 2. In the OFF state of FET 2, switches 82 and 88 are in the downward position, connecting gate terminal 78 through reverse blocking diode 94 to main electrode 64, and connecting gate terminal 84 through reverse blocking diode 96 to main electrode 66.

In the OFF state of FET 2 and during the first half cycle of AC source 76, the voltage on main electrode 66 rises positively with respect to main electrode 64. Junction 68 is forward biased and thus the potential level in the drift region of substrate 4 below junction 68 is at substantially the same level as electrode 66, namely within one junction drop of the latter. Left gate electrode 34 is relatively negative since it is tied through diode 94 to electrode 64 and the other side of the AC source. There is thus an electric field gradient established between right region 92 and the left gate electrode 34. The potential level along the left side of notch 12 in substrate 4 is at a very low level and increases as one moves vertically downwardly along the left edge of notch 12. The electric field gradient between the left and right edges of notch 12 causes attraction of given polarity carriers from substrate 4 into region 92.

As the positive voltage on right main electrode 66 rises higher, drift region portion 92 becomes more positively biased relative to left gate electrode 34, and the electric field gradient causes attraction of holes toward, and depletion of electrons away from, drift region portion 92. If the carrier concentration becomes great enough, the conductivity type of portion 92 is inverted to p type such that conduction occurs through an induced p channel along portion 92 around notch 12. A conduction channel so formed extends around to the left side of the notch, and junction 72 loses its reverse blocking ability, whereby FET 2 can no longer block voltage in its OFF state from source 76.

Shielding electrode 40 is connected by connection 48 to substrate 4 to be at the same potential level thereof and within one junction drop of main electrode 66, across junction 68. As the potential of main electrode 66 and thus substrate region 4 and drift region portion 92 rises, so also does shielding electrode 40. Shielding electrode 40 is insulated between gate electrode 34 and drift region portion 92 to thus shield the latter from the electric field gradient of the left gate electrode 34. Shield 40 thus prevents an electric field gradient from being established at drift region portion 92, whereby to prevent attraction of holes to the right edge of notch 12 at portion 92 below junction 68. As the potential level in drift region portion 92 rises, so does the potential level of shield 40, whereby the relatively negative left gate electrode 34 no longer affects the conductivity characteristics of drift region portion 92. Shield 40 thus prevents unwanted inducement of conduction channels in the drift region during the OFF state.

During the second half cycle of source 76, and during the OFF state of FET 2, left main electrode 64 rises positively with respect to right main electrode 66. Shield electrode 40 is connected by connection 48 to substrate 4 and rises positively therewith. Shield 40 and substrate 4 are at substantially the same potential as left main electrode 64, namely within a single junction drop thereof across junction 72. As the potential of left main electrode 64 becomes greater, so does the potential level of drift region portion 90 of substrate 4 due to the single junction drop thereto across junction 72. This potential rises positively with respect to right gate electrode 36 which is connected to negative right main electrode 66 through diode 96. If the applied voltage becomes great enough, the relatively negative right gate electrode 36 would establish a large enough electric field gradient across notch 12 to effect conductivity inversion and induce a conduction channel in drift region portion 90. Shield 40 prevents this unwanted inducement of conduction channels during the OFF state in the drift region. Shield electrode 40 is between right gate electrode 36 and drift region portion 90 and is at substantially the same potential level as left main electrode 64, and thus shields drift region portion 90 from any electric field gradient caused by right gate electrode 40.

Junctions 68 and 72 perform a steering diode function for referencing shield electrode 40. These junctions are already present in the integrated structure and the additional use thereof for steering purposes eliminates the need for dedicated discrete diodes to perform the steering function. The structure thus affords high OFF state voltage blocking capability with simplified structure and a reduced number of components.

Higher OFF state voltage blocking capability is further afforded by the increased drift region current path length. The current path between the main electrodes extends from each source region downwardly through the channel regions and downwardly and around the bottom 98 of the notch. This increases the drift region current path length and affords higher OFF state voltage blocking capability without increasing the lateral dimension along top major surface 6, whereby to afford high density, high voltage bidirectional FET structure with relatively low ON state resistance.

As seen in FIG. 1, a plurality of FETs are afforded in the integrated structure. N+ top layer 10 and p layer 8 are split and separated into laterally spaced respective source regions and channel regions by respective notches 14 and 16. Main electrode metalizations are provided comparably to that described, and connected in series in the AC load line, or in parallel as shown in FIG. 1. Left gate electrodes 102 and 104 are connected in parallel with left gate electrode 34 to gate terminal 78. Right gate electrodes 106 and 108 are connected in parallel with right gate electrode 36 to gate terminal 84. Shielding electrodes 44 and 46 are connected in parallel with shielding electrode 40 to substrate 4 by connection 48.

Main electrode 66 provides the source electrode for the FET to the left around notch 12, and also provides the source electrode for the FET to the right around notch 14. Main electrode 110 provides the drain electrode for the FET around notch 14, and also provides the drain electrode for the FET around notch 16. In the other half cycle of AC source 76, the roles of electrodes 66 and 110 are reversed, i.e. electrode 66 is the drain for its left and right FETs around respective notches 12 and 14, and electrode 110 is the source for its respective left and right FETs around respective notches 14 and 16. Alternate electrodes 64, 110 and so on, are thus connected to one side of the AC source, and the other alternate electrodes 66, 112 and so on, are connected to the other side of the AC source.

There is thus shown a lateral bidirectional shielded notch FET with a substrate-referenced shield, including: a first source region 50 of one conductivity type; a first channel region 58 of opposite conductivity type forming a junction 114 with first source region 50; a drift region 62 of the one conductivity type forming another junction 72 with the first channel region 58; a second channel region 60 of the opposite conductivity type forming a junction 68 with drift region 62; a second source region 52 of the one conductivity type forming a junction 116 with second channel region 60; a notch 12 extending between and separating the first and second source regions 50 and 52 and the first and second channel regions 58 and 60, and extending into drift region 62 in substrate 4; first insulated gate means 34 in notch 12 proximate first channel 58 and adapted for application of electrical potential for producing electric fields of sufficient intensity to invert the conductivity type in first channel region 58; second insulated gate means 36 in notch 12 proximate the second channel 60 and adapted for application of electrical potential for producing electric fields of sufficient intensity to invert the conductivity type in the second channel region 60; shielding means 40 in notch 12 insulated between the first and second gate means 34 and 36 and ohmically connected at connection 48 to substrate 4 to be at the same potential level thereof for preventing electric field gradient induced depletion in drift region portions 90 and 92 along the edges of notch 12; first and second main electrodes 64 and 66 ohmically contacting their respective source regions and channel containing regions such that in the OFF state the potential of drift region portions 90 and 92 of substrate 4 are within a junction drop of their respective main electrodes thereabove, across respective junctions 72 and 68; whereby upon application of voltage of either polarity to the first and second source regions 50 and 52 electric current can flow in a respective corresponding direction between them, under control of the electrical potential of the gate means, the conductive current path through drift region 62 traversing along one side of notch 12 then around the bottom end 98 thereof then along the other side of notch 12, and such that in the absence of electric gate potential, shielding means 40 prevents unwanted inducement of conduction channels in drift region 62.

FIGS. 2 through 6 show the preferred processing of the structure of FIG. 1, and like reference numerals are used where appropriate to facilitate clarity. Starting with a lightly doped n- substrate 4 in FIG. 2, for example having a donor density of about $5 \times 10^{14}$ donor atoms per cubic centimeter, p type epitaxial layer 8 is provided with boron at a density of about $5 \times 10^{17}$ donor atoms per cubic centimeter, and having a depth of about 3 microns. A silicon nitrite insulating layer 117, FIG. 3, is then deposited, followed by plasma etching to yield notch hole 12 down to level 24. After removal of the silicon nitrite, the n+ layer 10, FIG. 4, is then applied by ion implantation of arsenic, antimony, or the like, normal, i.e. 90°, to the substrate, followed by annealing to activate the implant and provide a depth of about 1 micron.

Porous silicon region 18, FIG. 5, is then formed by anodization in the presence of hydrogen fluoride. Contacts are placed on the top and bottom surfaces, and because of the PN junctions, current will only pass through the notch hole 12 to thus provide selective anodization through vertical region 18. A structural change is created in the silicon which remains single crystalline with substrate 4 but becomes porous. The depth of porous silicon region 18 at the bottom notch edge 98 is about 15 microns below top major surface 6. The substrate is then subjected to an oxidizing atmosphere such that the oxygen enters the pores in porous region 18 and rapidly oxidizes this region, whereby region 18 is still single crystalline with substrate 4 but substantially nonconductive. The width of notch 12 is about 5 to 15 microns.

During the oxidation, insulation layers are formed on the substrate, including insulation layers 30 and 32 along the vertical walls of the notch, FIG. 6. The porous silicon region 18 oxidizes much faster than the growth of the silicon dioxide layers whereby to afford process control enabling the gate oxide insulating layers along channels 58 and 60 along the vertical walls of the notch hole 12. Gate electrodes 34 and 36 are then deposited, for example by shadow evaporation at an angle across each side of the notch or LPCVD with polysilicon. Insulating layer 38 is then provided by low temperature chemical vapor deposition. Shielding electrode 40 is provided by deposition preferably of titanium disilicide which is conductive. The top insulating silicon dioxide layer 42 is then deposited. The substrate is then masked and etched, followed by aluminum metalization sputtered or deposited to yield main electrodes 64, 66, 110, 112 and so on, FIG. 1.

Figure 7:
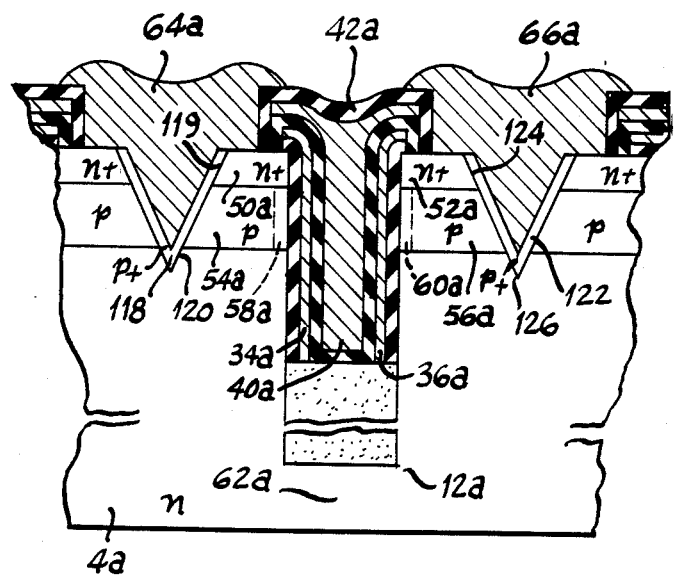
FIGS. 7 and 8 show alternate embodiments of FIG. 1.

FIG. 7 shows alternative structure to that of FIG. 1, and like reference numerals are used with the postscript "a" where appropriate to facilitate clarity. First main electrode means 64a extends into and through the first source region 50a, and into and through the first channel containing region 54a, and into drift region 62a of substrate 4a. First main electrode means 64a includes a layer 118 of p type semiconductor material extending contiguously along the first main electrode means and forming a junction 119 with first source region 50a and forming a junction 120 with drift region 62a.

Second main electrode means 66a likewise extends into and through second source region 52a, and into and through the second channel containing region 56a, and into drift region 62a of substrate 4a. Second main electrode means 66a includes a layer 122 of p type semiconductor material extending contiguously along the second main electrode means and forming a junction 124 with second source region 52a and forming a junction 126 with drift region 62a. Layers 118 and 122 are formed after the anisotropic etch in FIGS. 6 and 1 to open up the areas for main electrode deposition. Operation of the structure of FIG. 7 is comparable to that of FIG. 1. OFF state voltage blocking is provided by junctions 120 and 126, comparably to junctions 72 and 68 of FIG. 1.

Figure 8:
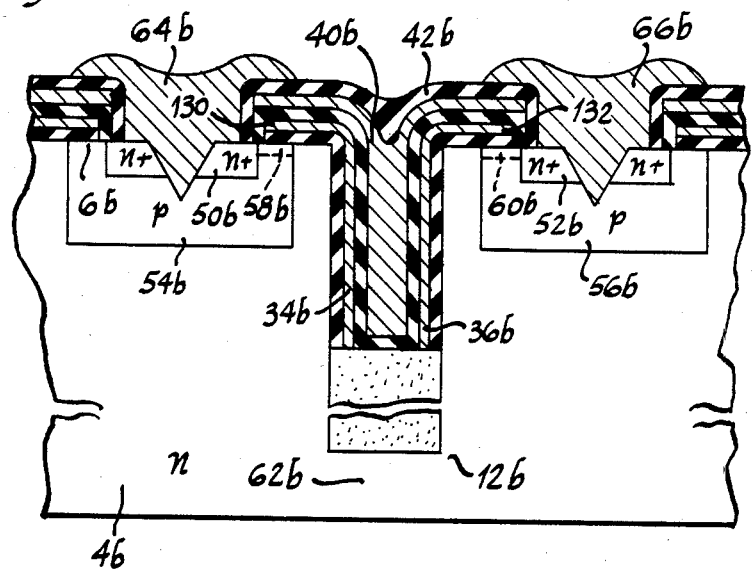

FIG. 8 shows further alternative structure to that of FIG. 1, and like reference characters are used with the postscript "b" where appropriate to facilitate clarity. The FET channels are provided by lateral channels 58b and 60b in p regions 54b and 56b from respective source regions 50b and 52b to the substrate drift region 62b of substrate 4b. Left insulated gate means 34b includes a portion 130 proximate to and insulated from lateral left channel 58b along top major surface 6b. Right insulated gate means 36b includes a portion 132 extending laterally and proximate to and insulated from lateral right channel 60b along top major surface 6b.

In further alternative, each of the main electrodes such as 64 does not extend downwardly below top major surface 6. Instead, for example, p region 54, FIG. 1, extends upwardly in area 134 to top major surface 6 to contact the main electrode thereabove and to separate left and right n+ regions 50 and 136 which may be diffused separated tubs. Main electrode 64 would thus contact both the n+ source region 50 and the channel containing region 54, which in turn affords contact through steering diode junction 72 to substrate 4 and shield 40 through connection 48.

It is recognized that various modifications are possible within the scope of the appended claims.

We claim:
1. A bidirectional FET, comprising:
a first source region of one conductivity type semiconductor material;
a first channel region of opposite conductivity type semiconductor material forming a junction with said first source region;
a single drift region of one conductivity type semiconductor material forming another junction with said first channel region;
a second channel region of said opposite conductivity type semiconductor material forming a junction with said drift region;
a second source region of said one conductivity type semiconductor material forming a junction with said second channel region;
a notch extending between and separating said first and second source regions and said first and second channel regions, and extending into said drift region;
first insulated gate means in said notch proximate said first channel region and adapted for application of an electrical potential for producing electric fields of sufficient intensity to invert the conductivity type in said first channel region;

second insulated gate means in said notch proximate said second channel region and adapted for application of an electrical potential for producing electric fields of sufficient intensity to invert the conductivity type in said second channel region;

whereby upon application of voltage of either polarity to said first and second source regions, electric current can flow in a respective corresponding direction between them, under control of said electrical potential of said gate means, the conductive current path through said drift region traversing along one side of said notch then around the end thereof then along the other side of said notch, and such that in the absence of said electric gate potential, said FET is in an OFF state blocking current flow in both directions, said single drift region around said notch supporting OFF state blocking voltage in both directions; and shielding means in said notch insulated between said first and second gate means and ohmically connected to said drift region to be at substantially the same potential level thereof for preventing electric field gradient induced depletion in said drift region along said notch in said OFF state, to prevent unwanted inducement of conduction channels.

2. The invention according to claim 1 wherein said channel regions are laterally spaced by said notch, and said notch extends downwardly from a top major surface of said FET, said channel regions extending generally vertically along respective sides of said notch, said drift region being below said channel regions.

3. The invention according to claim 2 wherein said source regions are laterally spaced along said top major surface by said notch therebetween, said source regions being above respective said channel regions, wherein said notch extends downwardly into said drift region a substantial distance below said first and second gate means to substantially diminish attraction of carriers by said gate means from said drift region toward the edges of said notch, to prevent unwanted inducement of conduction channels in said OFF state and afford higher OFF state voltage blocking capability.

4. The invention according to claim 2 comprising:

a pair of main electrodes each connected to a respective said source region;

said first insulated gate means comprising first insulation layer means on an inner surface of said notch along said first channel region, and first gate electrode means in said notch extending along said first insulation layer means such that said first gate electrode means extends in close proximity along and insulated from said first vertical channel region; and said second insulated gate means comprising second insulation layer means on an inner surface of said notch along said second channel region, and second gate electrode means in said notch along said second insulation layer means such that said second gate electrode means extends in close proximity along and insulated from said second vertical channel region.

5. The invention according to claim 4 wherein during said OFF state, the junction between said drift region and one of said channel regions blocks current flow toward one of said main electrodes, and the junction between said drift region and the other of said channel regions blocks said current flow toward the other of said main electrodes.

6. The invention according to claim 5 wherein each of said first and second gate electrode means is referenceable to a common potential level with a respective one of said main electrodes in said OFF state of said FET, said shielding means being referenced to said drift region such that in said OFF state the potential of said shielding means is substantially within a junction drop of the potential of said main electrodes, the potential of said shielding means being substantially the same as the potential in said drift region along the edge of said notch below the respective said channel region, whereby said shielding means shields said last mentioned notch edge drift region portion from electric field gradients from the gate electrode means along the opposite notch edge, to thus prevent attraction of given polarity carriers in said drift region towards the edges of said notch, to prevent electric field gradient induced depletion and hence prevent unwanted inducement of conduction channels in said drift region during said OFF state.

7. The invention according to claim 1 wherein said notch extends downwardly into said drift region a substantial distance below said first and second gate means to substantially diminish attraction of carriers by said gate means from said drift region toward the edges of said notch, to prevent unwanted inducement of conduction channels in said OFF state and afford higher OFF state voltage blocking capability.

8. The invention according to claim 7 wherein the portion of said notch below said gate means comprises anodized single crystalline porous silicon oxidized to a substantially insulative condition.

9. The invention according to claim 7 where said channel regions are laterally spaced by said notch, and said notch extends downwardly from a top major surface of said FET, said drift region being below said channel regions and around the bottom of said notch, and wherein said shielding means extends downwardly in said notch to about the depth of the lowermost extent of said gate means.

10. The invention according to claim 9 wherein said source regions are laterally spaced along said top major surface by said notch therebetween, said main electrode means extending downwardly through respective said source regions.

11. The invention according to claim 10 wherein said channel regions extend generally vertically along distal sides of said notch, said source regions being above respective said channel regions.

12. The invention according to claim 1 wherein said channel regions extend generally horizontally along a top major surface between a respective said source region and said drift region, said gate means including portions extending horizontally along said top major surface above respective said channel regions.

13. The invention according to claim 12 wherein said channel regions are laterally spaced by said notch, and said notch extends downwardly from said top major surface.

14. The invention according to claim 13 wherein said source regions are laterally spaced along said top major surface by said notch therebetween.

15. A bidirectional lateral power FET, comprising:

a substrate of semiconductor material of one conductivity type having a top major surface;

a pair of channel regions of the other conductivity type laterally spaced in said substrate;

a pair of source regions of said one conductivity type laterally spaced along said top major surface and each forming a junction with a respective one of said channel regions;

a notch in said substrate extending downwardly from said top major surface between said source regions and said channel regions into a single drift region in said substrate, such that the conductive current path is directed from one source region through one said channel region, then into said drift region and along said one side of said notch, then around the bottom of said notch, then along the other side of said notch in said drift region, then through the other said channel region to said other source region, with the same path conducting current in the reverse direction from said other source to said one source region;

a first main electrode connected to said first source region and said first channel region;

a second main electrode connected to said second source region and said second channel region;

first insulated gate electrode means proximate the first said channel region for attracting given polarity carriers to invert said first channel region to said one conductivity type in response to given gate potential, such that current may flow in a first direction between said main electrodes;

second insulated gate electrode means proximate the second said channel region for attracting given polarity carriers to invert said second channel region to said one conductivity type in response to given gate potential, such that current may flow in a second direction between said main electrodes; and shielding means in said notch insulated between said first and second gate electrode means and ohmically connected to said drift region to be at substantially the same potential level thereof to shield the portion of said substrate drift region along the edge of said notch from electric field gradients from the gate electrode means along the opposite edge of the notch, and prevent depletion and unwanted inducement of conduction channels in said drift region during an OFF state of said FET, said single drift region around said notch supporting OFF state blocking voltage in both directions.

16. The invention according to claim 15 wherein:

said main electrodes are connectable to an AC load lines;

each said first and second gate electrode means is connectable to gate potential source means;

such that said first gate electrode means is positive with respect to one of said main electrodes during the first half cycle of said AC line, and said second gate electrode means is positive with respect to the other of said main electrodes during the second half cycle of said AC line;

such that during the first half cycle of said AC line, current flows from said other main electrode through the other source region, through said other channel region, through said substrate drift region around the bottom of said notch, through said one channel region, through said one source region to said one main electrode; and such that during the second half cycle of said AC line, current flows from said one main electrode through said one source region, through said one channel region, through said substrate drift region around the bottom of said notch, through said one channel region, through said other source region to said other main electrode.

17. The invention according to claim 16 wherein said FET is in said OFF state in the absence of said given gate potential, with the junction between said substrate drift region and said one channel region blocking current flow towards said one main electrode, and with the junction between said substrate drift region and said other channel region blocking current flow toward said other main electrode.

18. The invention according to claim 17 wherein said first gate electrode means is referenceable in said OFF state to said one main electrode, said second gate electrode means is referenceable in said OFF state to said other main electrode, and said shielding means is substantially within one junction drop of said main electrodes, during said first half cycle in said OFF state, said junction between said other channel region and said substrate drift region being forward biased such that the potential in said drift region is substantially the same as the potential on said other main electrode, said first gate electrode means being at the potential of said one main electrode, said shielding means being at the potential of said drift region and one junction drop below said other main electrode, said shielding means being between said first gate electrode means and the portion of said drift region along the edge of said notch below said other channel region whereby to shield said last mentioned drift region portion from the electric field gradient from said first gate electrode means otherwise causing attraction of given polarity carriers in said last mentioned drift region portion to said edge of said notch below said other channel region causing unwanted depletion and inducement of conduction channels, during said second half cycle in said OFF state, said junction between said one channel region and said substrate drift region being forward biased such that the potential in said drift region is substantially the same as the potential on said one main electrode, said second gate electrode means being at the potential of said other main electrode, said shielding means being at the potential of said drift region and one junction drop below said one main electrode, said shielding means being between said second gate electrode means and the portion of said drift region along the edge of said notch below said one channel region whereby to shield said last mentioned drift region portion from the electric field gradient from said second gate electrode means otherwise causing attraction of given polarity carriers in said last mentioned drift region portion to said edge of said notch below said one channel region causing unwanted depletion and inducement of conduction channels.

19. The invention according to claim 18 wherein:

during said first half cycle of said AC line, in an ON state of said FET, current flows from said other main electrode momentarily across a forward biased junction therebelow between said other channel region and said substrate drift region, and then flows through said one channel region to said one source region and said one main electrode, the falling potential in said substrate across said forward biased junction relative to said other gate electrode means causing said other gate electrode means to attract given polarity carriers to said other channel region to invert the latter to said one conductivity type, such that the main current path during said first half cycle is from said other main electrode through said other source region, through said other channel region, through said substrate drift region around the bottom of said notch, through said one channel region, through said one source region, to said one main electrode; and such that during the second half cycle of said AC line, in the ON state of said FET, current flows from said one main electrode momentarily across a forward biased junction therebelow between said one channel region and said substrate drift region and then flows through said other channel region to said other source region and said other main electrode, the falling potential in said substrate across said last mentioned forward biased junction relative to said one gate electrode means causing said one gate electrode means to attract given polarity carriers to said one channel region to invert the latter to said one conductivity type, such that the main current path during said second half cycle is from said one main electrode, through said one source region, through said one channel region, through said substrate drift region around the bottom of said notch, through said other channel region, through said other source region to said one main electrode.

* * * * *